(12) United States Patent
Ferenc

(10) Patent No.: US 6,674,063 B2
(45) Date of Patent: Jan. 6, 2004

(54) PHOTOSENSOR WITH A PHOTOCATHODE IN REFLECTIVE MODE

(75) Inventor: Daniel Ferenc, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 224 days.

(21) Appl. No.: 09/892,705

(22) Filed: Jun. 26, 2001

(65) Prior Publication Data

US 2002/0024300 A1 Feb. 28, 2002

Related U.S. Application Data

(60) Provisional application No. 60/214,328, filed on Jun. 27, 2000.

(51) Int. Cl.[7] ................................................ H01J 40/14
(52) U.S. Cl. ................................. 250/214 VT; 313/536
(58) Field of Search ........................ 250/207, 214 VT; 313/523, 524, 541, 542, 544, 106, 107, 536

(56) References Cited

U.S. PATENT DOCUMENTS 3,771,004 A    11/1973   Plumeau

FOREIGN PATENT DOCUMENTS

| DE | 861 296 C | 12/1952 |
| DE | 11 06 436 B | 5/1961 |

OTHER PUBLICATIONS

Ferenc, D., "Imaging Hybrid Photon Detectors with a Reflective Photocathode", Nuclear Instruments and Methods in Physics Research A 442 (2000) pp. 150–153.

Grigor'ev et al., "A Cerenkov Counter for Charged–Kaon and Pion Indentification in the Momentum Range of 600–700 MeV/c", Nuclear Experimental Techniques, vol. 41, No. 6, 1998, pp. 803–809.

(List continued on next page.)

Primary Examiner—Stephone B. Allen
(74) Attorney, Agent, or Firm—John P. O'Banion

(57) ABSTRACT

A hybrid photon detector with a photocathode in reflective mode where the same vacuum tube components acts both as a perfect incoming light concentrator and as a perfect focusing electron lens and the photoelectrons are electrostatically focused by the same CPC-shape in the opposite direction (i.e., from the small light collection surface towards a point-like region in the middle of the large-area entrance aperture). The CPC is electrically conductive and split into two electrodes by a narrow nonconductive interval positioned in a particular place along the CPC. The photocathode covers the light collection area of the CPC, and the photocathode is operated in the reflective mode such that photoelectrons emerge from the same surface through which the photons enter. Photoelectrons emerging from the entire photocathode are accelerated and focused onto a small electronic sensor placed in the middle of the entrance aperture of the CPC.

72 Claims, 7 Drawing Sheets

OTHER PUBLICATIONS

Ferenc et al., "Solutions to the ion feedback problem in hybrid photon detectors and photomultiplier tubes", Nuclear Instruments and Methods in Physics Research A 427 (1999), pp. 518–523.

Radu et al., "Design studies for nonimaging light concentrators to be used in very high–energy gamma–ray astronomy", Nuclear Instruments and Methods in Physics Research A 446 (2000) pp. 497–505.

Ferenc, D., "New Developmetns in Hybrid Photon Detectors", Proceedings of the 36th Workshop on the INFN Eloisatron Project, Nov. 1997, pp. 131–140.

"New Developments in Hybrid Photon Detectors," Daniel Ferenc; New Dectectors, 36th Workship of the INFN Eloisatron Project, Ettore Majorana Centre for Scientific Culture, Erice, Trapani, Sicily, Nov. 1–7, 1997, pp. 1–10.

"A Lego Hybrid Photon Detector—Assembled From Standard Mass–Produced Vacuum Components," Daniel Ferenc; Eckart Lorenz; Razmik Mirzoyan; Nuclear Instruments and Methods in Physics Research—Section A, vol. 442, 2000, pp. 124–127.

"An Evaluation of the New Compact Hybrid Photodiodes R711U–07/40 From Hammamatsu In High–Speed Light Detection Mode," Razmik Mirzoyan; Daniel Ferenc; Eckart Lorenz; Nuclear Instruments and Methods in Physics Research—Section A, vol. 442, 2000, pp. 140–145.

"Imaging Hybrid Photon Detectors With a Reflective Photocathode," Daniel Ferenc; Nuclear Instruments and Methods in Physics Research—Section A, vol. 442, 2000, pp. 150–153.

"Imaging Hybrid Photon Detectors With Minimized Dead Area and Protection Against Positive Ion Feedback," Daniel Ferenc; Nuclear Instruments and Methods in Physics Research—Section A, vol. 431, 1999, pp. 460–475.

"Solution to the Ion Feedback Problem in Hybrid Photon Detectors and Photomultiplier Tubes," Daniel Ferenc; Dario Hrupec; Eckart Lorenz; Nuclear Instruments and Methods in Physics Research—Section A, vol. 427, 1999, pp. 518–523.

PHOTOSENSOR WITH A PHOTOCATHODE IN REFLECTIVE MODE

CROSS-REFERENCE TO RELATED APPLICATIONS

This application claims priority from U.S. Provisional Application Ser. No. 60/214,328 filed on Jun. 27, 2000, incorporated herein by reference.

BACKGROUND OF THE INVENTION

1. Field of the Invention

This invention pertains generally to photosensors, and more particularly to a photosensor that incorporates high quantum energy photocathodes operated in reflection mode.

2. Description of the Background Art

Research in the area of high-energy physics and high-energy astrophysics is often based on the detection of Cherenkov or fluorescence photons emitted by charged particles in a wide variety of transparent media. Efficient photon detection is a key element that is common to this work.

At present, conventional PhotoMultiplier Tubes (PMTs) are used in most of these applications because they combine affordability with good timing properties. However, PMTs tend to suffer from poor single-photon resolution and low quantum efficiency. Furthermore, PMTs based on reflective photocathodes have reached a very limited application, mainly because of their large dead area and non-uniform angular acceptance.

Hybrid Photon Detectors (HPDs) provide excellent single-photon resolution, but by) fail to offer higher quantum efficiency because they tend to be based on the same photocathode materials as PMTs. On the other hand, HPDs housing GaAs and GaAsP photocathodes in transmission mode have been recently developed that offer peak quantum efficiency of up to approximately 50%. However, due to the complicated Molecular Beam Epitaxy (MBE) process used in manufacturing, these HPDs have been very expensive. In addition, they suffer from a large dead area and difficulties in the formation of compound hexagonally packed imaging cameras. An imaging HPD based on a reflective photocathode formed in a bend structure has been developed as well, but has been relatively difficult to manufacture and suffers from narrow angular acceptance and poor resolution in response time.

In a typical transmission-type photocathode, photons enter the photocathode layer from one side, while the photoelectrons emerge into vacuum on the opposite side of the layer. This concept is far from being optimal since the electrons have to be emitted at a surface that is far from the place of their most abundant creation, i.e., the surface on the opposite side of the layer. Electrons have a relatively low chance to diffuse from the region close to the photon entry surface to the surface on the opposite side. The design of a transmission photocathode has therefore always been a compromise between two conflicting requirements: (a) efficient photon conversion and (b) successful electron diffusion to the surface.

The situation is fundamentally different in reflection-type photocathodes since the electrons are emitted through the same surface the photons have entered. The majority of electron-hole pairs are created very close to the photon entrance surface (due to the Lambert-Beer exponential law) and therefore have a high chance of reaching the same surface and escaping though it into vacuum. As a result, reflection cathodes offer quantum efficiency nearly twice that of transmission photocathodes. The sensitivity to ultraviolet (UV) light is enhanced even more, since the short wavelength photons are absorbed closer to the surface.

Apart from a considerable increase in quantum efficiency and an important widening of the spectral response into the short wavelength range, reflection photocathodes offer other very important advantages. The most important advantage is the significant simplification of the photocathode manufacturing process, and a consequent price reduction. This general feature in particular concerns the most efficient but extremely expensive III–V semiconductor photocathodes (e.g., GaAs, GaAsP, InGaAs, etc.) processed by MBE expitaxial growth in an ultra high vacuum. A typical production process for transmission-type III–V photocathodes consists of approximately ten different steps, starting from expitaxial growth of a thin photocathode layer on top of a crystal substrate with matched lattices constant, fusion of the grown structure to the photube entrance window with the help of previously MBE-deposited additional interface layers, and finally removal of the growth substrate from the opposite side of the photocathode layer.

In contrast, the production of a reflection-type III–V photocathode is much simpler since there is no need to fuse the grown photocathode structure with the glass window and to remove the growth substrate. This leads to a very significant cost reduction that is likely to bring the III–V photocathodes into an affordable price range, with unprecedented high quantum efficiency (e.g., for GaAsP, approximately two to three times higher than that of transmission bialkalai photocathodes). In addition, while for a typical transmission-type photocathode a thick conductive sub-layer has to be deposited between the glass window and the photocathode, in a reflection-type photocathode the thickness and the optical properties of this conductive sub-layer are not critical since photons do not need to pass through. Although only around twenty atomic layers thin when used with transmission photocathodes, this sub-layer (e.g., SnO or indium-tin-oxide) absorbs about 25% of the incoming light, which presents a significant loss even before the light has reached the transmission photocathode. In contrast, reflection photocathodes may even benefit from the conductive layer underneath, since it may serve as a mirror that reflects transmitted light back through the photocathode layer, thus providing the photon with another conversion opportunity.

In spite of these striking advantages, reflection-type photocathodes have never had a wide application in photosensor devices due to the lack of a phototube design that would simultaneously host a photocathode in a reflection configuration, and provide the following important features: (a) negligible dead area; (b) flat angular acceptance and sharp angular cutoff for detected light, (c) fast and position-independent time response, and (d) the possibility of close packing of individual units into large-area multi-pixel honeycomb imaging cameras.

Accordingly, there has been a strong need for a new kind of photosensor that would be able to incorporate photocathodes of the highest quantum efficiency at a relatively low cost. Such photosensors may replace conventional PMTs in many applications (e.g., physics, astronomy, industry, medicine) where high quantum efficiency, single-photon resolution, negligible dead area and other important properties are required. Among the different photocathode types, epitaxially grown III–V photocathodes (such as GaAsP, GaAs, and InGaAs) provide the highest possible quantum efficiency. As stated previously, for example, the quantum efficiency of GaAsP photocathodes may reach almost fifty percent.

Single-photon sensitivity, single-photon resolution, excellent time resolution, low noise, and, most important, high quantum efficiency (e.g., >50%), are key features of an ideal, but so far nonexistent photosensor. A photosensor comprising all of these qualities at a low price would open a new range of sensitivity in different frontiers, such as photon decay, neutrino oscillations, neutrino astronomy, gamma-ray astronomy, and the like. The present invention satisfies those requirements, as well as others, and overcomes deficiencies found in conventional photosensors.

BRIEF SUMMARY OF THE INVENTION

The present invention generally comprises a photocathode operating in the so-called "reflection mode" instead of the traditional transmission mode. By way of example, and not of limitation, a photosensor according to the present invention combines reflective mode photocathode technology with compound parabolic light concentrator (CPC) technology wherein the same vacuum tube components act both as an incoming light concentrator and as a focusing electron lens. The interior of the CPC is electrically conductive and split into two electrodes by a non-conductive interval, such that photoelectrons emitted by the photocathode are electrostatically focused by the same CPC-shape onto a small light collection surface at entrance end of the photosensor.

Reflection photocathodes offer much higher quantum efficiency with the same photocathode material. However, they have never been widely used due to the lack of a photosensor configuration that would be able to host the reflection photocathode without significant sacrifices in effective sensitive area, photon angular acceptance, and time resolution. The photosensor configuration of the present invention overcomes those problems, facilitates the long-awaited significant increase in quantum efficiency, and provides further improvements in overall design and operational characteristics.

According to an aspect of the invention, type III–V material is used for the reflective mode photocathode since the manufacturing process is radically simpler and less expensive than the manufacturing process of a photocathode in transmission mode. In contrast to the production of photosensors hosting transmission photocathodes, the production of a photosensor based on the present invention requires neither the fusion of the epitaxially grown photocathode surface with the entrance window of the photosensor, nor the removal of the thick epitaxial growth substrate from the opposite side. Apart from that, the intrinsic quantum efficiency is higher for reflective-mode photocathodes.

In accordance with another aspect of the invention, the same vacuum tube components act both as a perfect incoming light concentrator and as a perfect focusing electron lens. The former assures that all the incoming photons will reach the photocathode, and the latter enables all of the emitted photoelectrons to hit the semiconductor sensor.

The present invention is based on the discovery that Compound Parabolic light Concentrators (CPCs or Winston cones), known to provide the most efficient non-imaging light concentration may simultaneously act as ideal focusing lenses. While the light is focused in one direction along the axis of a cylindrically symmetric CPC (i.e., from the large-area entrance to the small-area light collection surface), in the present invention the photoelectrons are electrostatically focused by the same CPC-shape in the opposite direction (i.e., from the small light collection surface towards a point-like region in the middle of the large-area entrance aperture).

Therefore, in accordance with the present invention a CPC must be electrically conductive. In accordance with another aspect of the invention, the electrically conductive CPC is split into two electrodes by a narrow non-conductive interval positioned in a particular place along the CPC. In the present invention, the photocathode covers the light collection area of a CPC, which assures that essentially all the light accepted by the CPC is collected on the photocathode surface. Since the CPC will concentrate light in the most efficient way, this configuration provides the best possible usage of the photocathode surface. The photocathode is operated in the reflective mode; that is, the photoelectrons emerge from the same surface through which the photons enter. Photoelectrons emerging from the entire photocathode are accelerated and focused onto a small electronic sensor placed in the middle of the entrance aperture of the CPC.

An object of the invention is to provide the highest possible quantum efficiency at a low manufacturing cost.

Another object of the invention is to provide for optimal usage of the photocathode surface.

Another object of the invention is to provide a negligible dead area.

Another object of the invention is to provide for flat angular acceptance for incoming light.

Another object of the invention is to provide for sharp angular cutoff for incoming light at a required incidence angle.

Another object of the invention is to provide for the possibility of modifying the lateral shape of the entrance section of the phototube from circular to hexagonal, without degradation of performance.

Another object of the invention is to provide for hexagonal honeycomb close packing of photosensors into large-area imaging cameras.

Another object of the invention is to eliminate the need for additional light concentrators or stray light protection.

Another object of the invention is to provide for fast and position-independent time response.

Another object of the invention is to provide single-photon resolution.

Another object of the invention is to provide for color sensitivity without destructive filtering.

Another object of the invention is to provide for extended spectral sensitivity.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

For illustrative purposes the present invention is embodied in the apparatus generally shown in FIG. 1 through FIG. 10. It will be appreciated that the apparatus may vary as to configuration and as to details of the parts, however, without departing from the basic concepts as disclosed herein.

Figure 1:
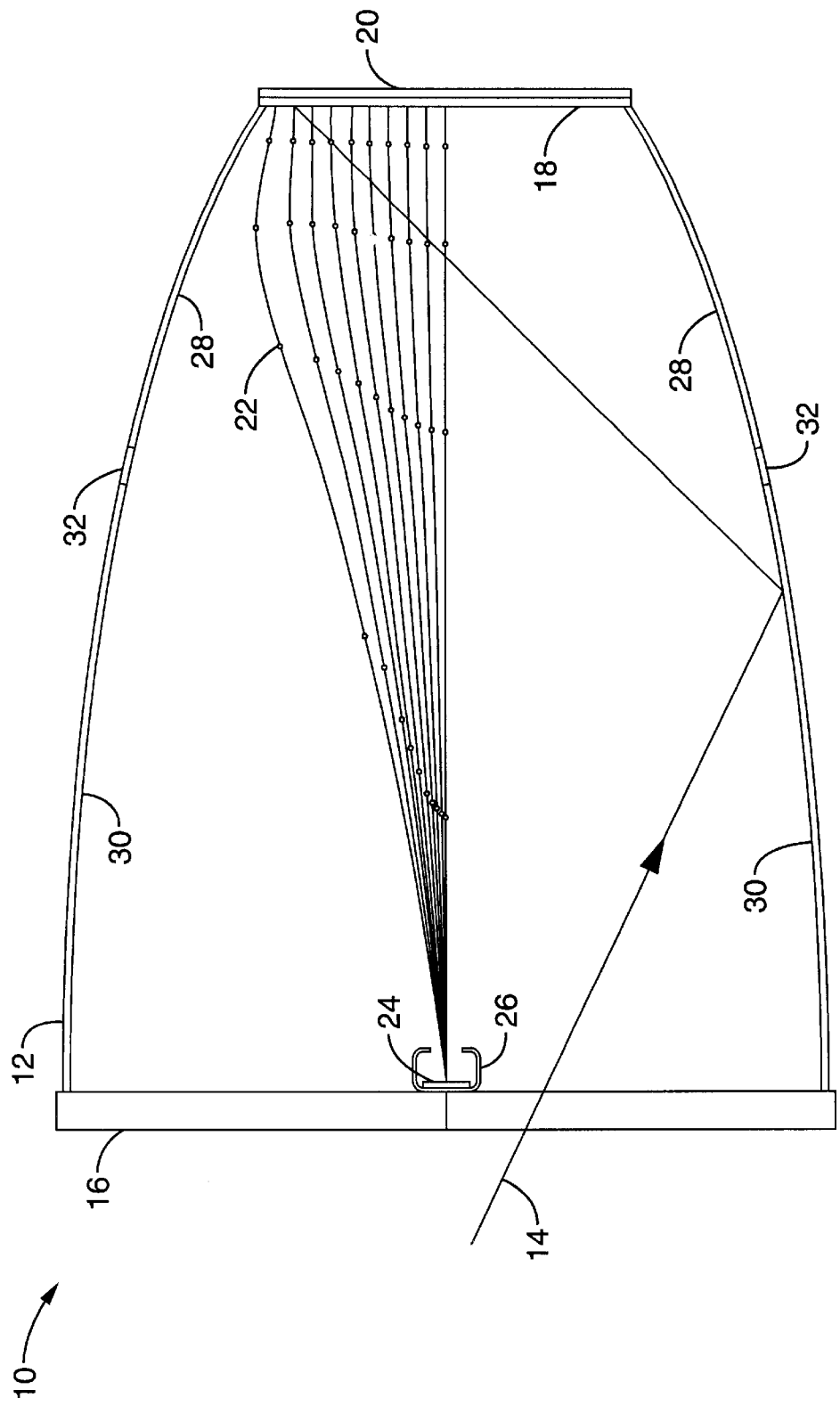
FIG. 1 is a side schematic view of an embodiment of a photosensor with a photocathode in reflective mode according to the invention.

Referring first to FIG. 1, an embodiment of a photosensor 10 according to the present invention is schematically shown. It will be appreciated by those skilled in the art that the components that will be described herein would be contained within an evacuated chamber or envelope 12 fabricated from glass, metal or other material suitable for holding a vacuum.

Envelope 12 is configured as a Compound Parabolic light Concentrator (CPC) which is also known as a Winston cone. CPCs are known to provide the best possible non-imaging light concentration ratio, with flat angular acceptance and sharp angular cutoff for the incoming light. The CPC example shown in FIG. 1 is intended to depict a CPC with a cutoff at 30° incidence angle and a fourfold surface reduction. Consequently, essentially all of the light which enters the CPC through an entrance aperture at one end will be concentrated and passed through an exit aperture at the opposite end due to the shape of the cone. The present invention, however, does not have an exit aperture. Instead, the invention is configured such that a photon 14 entering through a entrance window 16 at an angle of incidence small than the design cutoff angle will be directed onto a reflection-type photocathode 18 that is coated onto, or positioned adjacent to, a cathode plate 20 instead of exiting the envelope. Entrance window 16 is preferably a glass plate that is transparent to light at the wavelengths of interest. Cathode plate 20 is also preferably a glass plate but, as explained previously, the photons at the selected wavelength (s) do not pass through cathode plate 20. Instead, those photons enter photocathode 18 and cause photoelectrons 22 to be ejected out of the photocathode and directed toward a sensor 24.

It will be appreciated that in order for light 14 entering entrance window 16 to be directed to photocathode 20, the inner surface of envelope 12 must be reflective. This is preferably accomplished by coating the interior walls of envelope 12 with a reflective material, or lining the interior walls with a reflective material such as 3M® polymer mirror foil or the like. With the 3M® mirror foil, reflectivity of more than 99% has been achieved through an innovative application of the birefringence effect in a stack of differently oriented thin foils, fused together. The material is also a dielectric, which provides electric decoupling of the reflective surface from the high voltage electrodes that will be described later.

Additionally, the cutoff angle of envelope 12 must fall within the desired range. As indicated above, the embodiment shown in FIG. 1 is intended to represent a photosensor optimized for a cutoff incidence angle of 30°. Equivalent results may be achieved, however, with other acceptance angles ranging from approximately 10° to approximately 50° and angular spreads ranging from approximately 30° to approximately 90°. Furthermore, the example presented in FIG. 1 depicts a theoretical maximum light concentration factor for the light accepted with an incidence angle of less than 30°; namely a factor of two in diameter or a factor of four in area. In other words, the diameter of entrance window 12 is twice the diameter of photocathode 20. The actual sizes can vary, but an example would be an entrance window having a diameter of two inches and a photocathode having a diameter of one inch. The angular spread of the light at the collection surface is consequently maximal (i.e., 90°). Note, however, that the present invention is not limited to use of maximum concentration CPCs and may be practiced equivalently with CPCs of a lower concentration factor and narrower angular spread of light at the collection surface as well. Such less "efficient" CPCs may be of certain advantage in avoiding light reflections from the photocathode surface, but would lead to an increase in size of the photocathode surface. Also, envelope 12 may be a cylindrically symmetric device, as shown in FIG. 1, as well as a two-dimensional CPC shape extruded in the third dimension in which case an elongated electron sensor would be needed in the latter case.

As shown in FIG. 1, and explained above, photon 14 enters the photosensor through the entrance window 16 and reaches photocathode 18 either directly, or after one or more reflections from the CPC mirror. Photocathode 18 is operated in the reflective mode so that photons that enter the photocathode surface release photoelectrons from the same surface. Preferably, photocathode 18 comprises a type III–V material such as GaAsP for efficiency, but photocathode 18 can be any reflective photocathode. GaAsP is currently the most sensitive photocathode material for visible light.

When a photon 14 hits photocathode 18, the photocathode simultaneously focuses and accelerates photoelectrons 22 emerging from photocathode 18 in the opposite direction onto a point-like electron sensor 24 attached to and positioned in the center of entrance window 16. Sensor 24 can be a P-I-N diode, an Avalanche Photo Diode (APD) such as used in Hybrid Photon Detectors (HPDs), a scintillator, or any suitable sensor. Preferably, sensor 24 is enclosed in a positive-ion feedback protection electrode 26 of the type described in D. Ferenc et al., "Solution to the Ion Feedback Problem in Hybrid Photon Detectors and Photomultiplier Tubes", Nucl. Instr. Meth. A427(1999), pp. 518–523, D. Ferenc et al., "A LEGO Hybrid Photon Detector-assembled from standard mass-produced vacuum components", Nucl. Instr. Meth. A442 (2000), pp.124–127, and D. Ferenc, "Imaging Hybrid Photon Detectors with Minimized Dead Area and Protection Against Positive Ion Feedback", Nucl. Instr. Meth. A431(1999), pp. 460–475, each of which is incorporated herein by reference.

While the light concentration is provided by the conical or tubular shape of envelope 12 and associated interior reflective coating, electron focusing is facilitated by interior annular electrodes 28, 30 that follow the shape of envelope 12. Electrodes 28, 30 can be created simply by using a conductive reflective material that is broken by a non-conductive annular gap 32. Alternatively, the reflective material can be non-conductive and electrodes deposited on the inner surface of envelope 12 before the reflective material so that the reflective material is backed by the electrode surfaces. Gap 32, which divides envelope 12 into two electrodes, is required for the functionality of the photosensor.

Therefore, an important aspect of the invention is that the CPC shape must be electrically conductive and split into at least two electrodes 28, 30 by a narrow non-conductive interval gap 32 positioned at a particular location place along the longitudinal axis of the CPC. The location of gap 32 changes with the size of the CPC; for example, for a CPC having a fifteen degree cutoff angle, gap 32 would be located closer to photocathode 18. This spaced apart electrode configuration, in combination with photocathode 18 and anode 24, effectively creates an electron lens.

Electrodes 28, 30 are kept at two different potentials which will be designated as U28 and U30 to match those reference numbers. From electron optics simulations it follows that a correct electron focusing may be achieved from a continuous multitude of combinations of U28 and U30. This unusual feature provides the important freedom to tune the potential gradient in front of the photocathode surface and allows the optimization of the quantum efficiency and the response-time properties of the device. Again, using component reference numbers to denote electrode potentials, for correct operation electrodes 18, 32, 28, 24 and 26 should be kept at potentials rising in the following order $U18 < U28 < U30 < U24 < U26$. The optimal values of these potentials, and the position of the non-conductive gap 32, may be determined empirically in electronoptics simulations.

Figure 2:
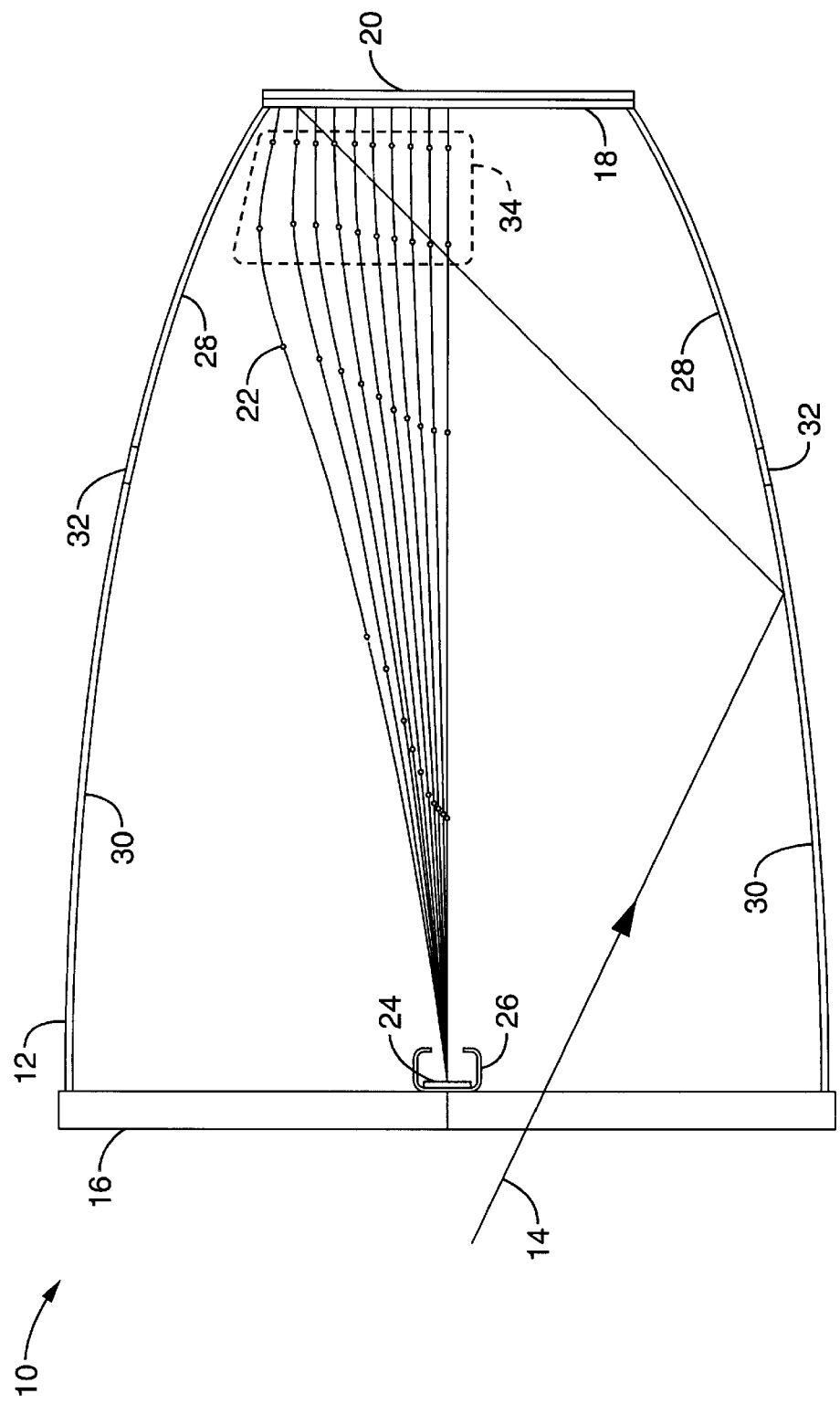
FIG. 2 is a side schematic view of the photosensor of FIG. 1 showing a region of magnetic field sensitivity.
Figure 3:
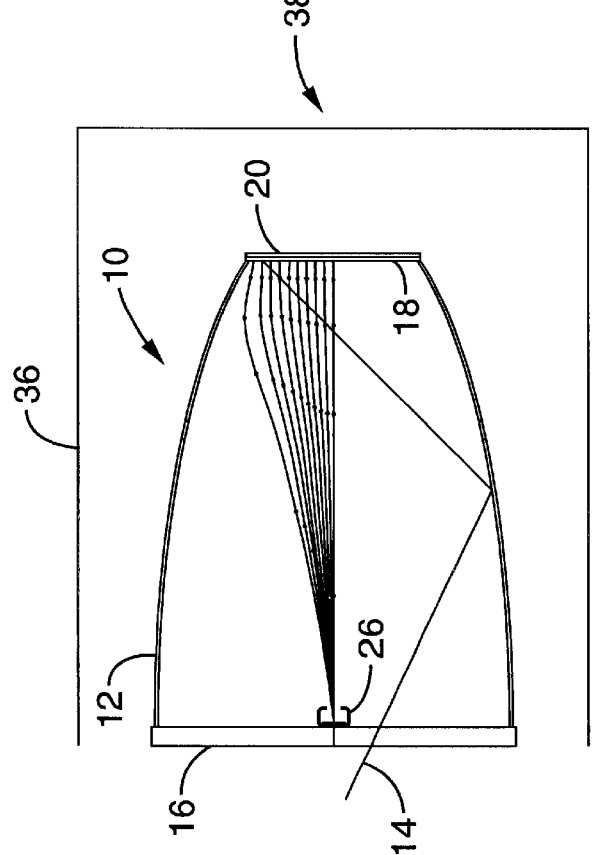
FIG. 3 is a side schematic view of the photosensor of FIG. 1 shown with a magnetic shield.

Note also that, in traditional phototubes with transmission photocathodes the situation is the opposite; in the region close to the entrance window the electron velocities are low, (i.e., most sensitive to magnetic deflection), which sometimes requires magnetic shielding to extend far in front of the entrance window and creates acceptance-shadowing (shadowing of the input photons). Referring now to FIG. 2 and FIG. 3, in contrast to PMTs and other transmission photocathode devices, electron velocities in the present invention are highest in the vicinity of entrance window 16 and lowest on the opposite side in region 34. The electrons in the vicinity of region 34 may be sensitive to magnetic deflection, thus requiring magnetic shielding 36 to be used. However, because electrons in the vicinity of entrance window 16 are less sensitive to magnetic deflection, there is no need for magnetic shielding 36 to extend beyond the front of entrance window 16. This means that acceptance-shadowing that is a problem in many conventional photosensors is eliminated in the present invention. Furthermore, magnetic shield 36 can be in the form of a cylinder or cone, and can be completely closed wall 38 behind the photocathode so as to provide unprecedented efficient shielding from magnetic fields.

Figure 4:
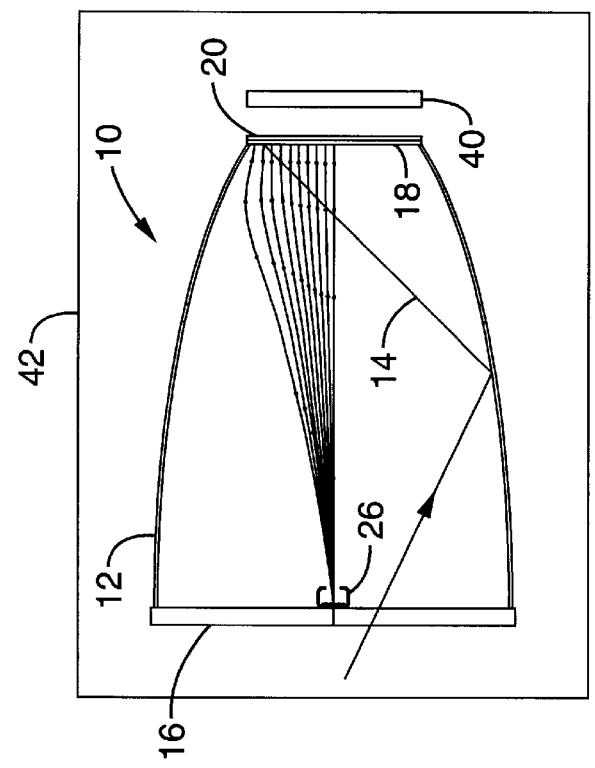
FIG. 4 is a side schematic view of the photosensor of FIG. 1 shown with a photocathode cooling element.

Referring to FIG. 4, it will be appreciated that some applications can be significantly limited by thermionic noise; that is, noise due to the thermal emission of electrons from a photocathode. One example is the measurement of solar neutrinos in a large water Cherenkov experiment (e.g., Super Kamiokande or UNO). The problem with traditional hemispherical PMTs based on transmission photocathodes has been in the direct thermal contact of the photocathode surface with water. In contrast, the photocathode of the present invention can be cooled to very low temperatures (e.g.,<−20° C.) because the photocathode is placed in a vacuum, is on the opposite side of the entrance window, and is thermally decoupled from the environment. Accordingly, a cooling unit 40, such as a Peltier cell cooler, can be placed on the back side of the photocathode. The resultant reduction in thermionic noise could be on the order of one-hundred to one-thousand depending on the photocathode material and the temperature. Alternatively, the photosensor could be placed in a container 42 filled with cold water.

Figure 6:
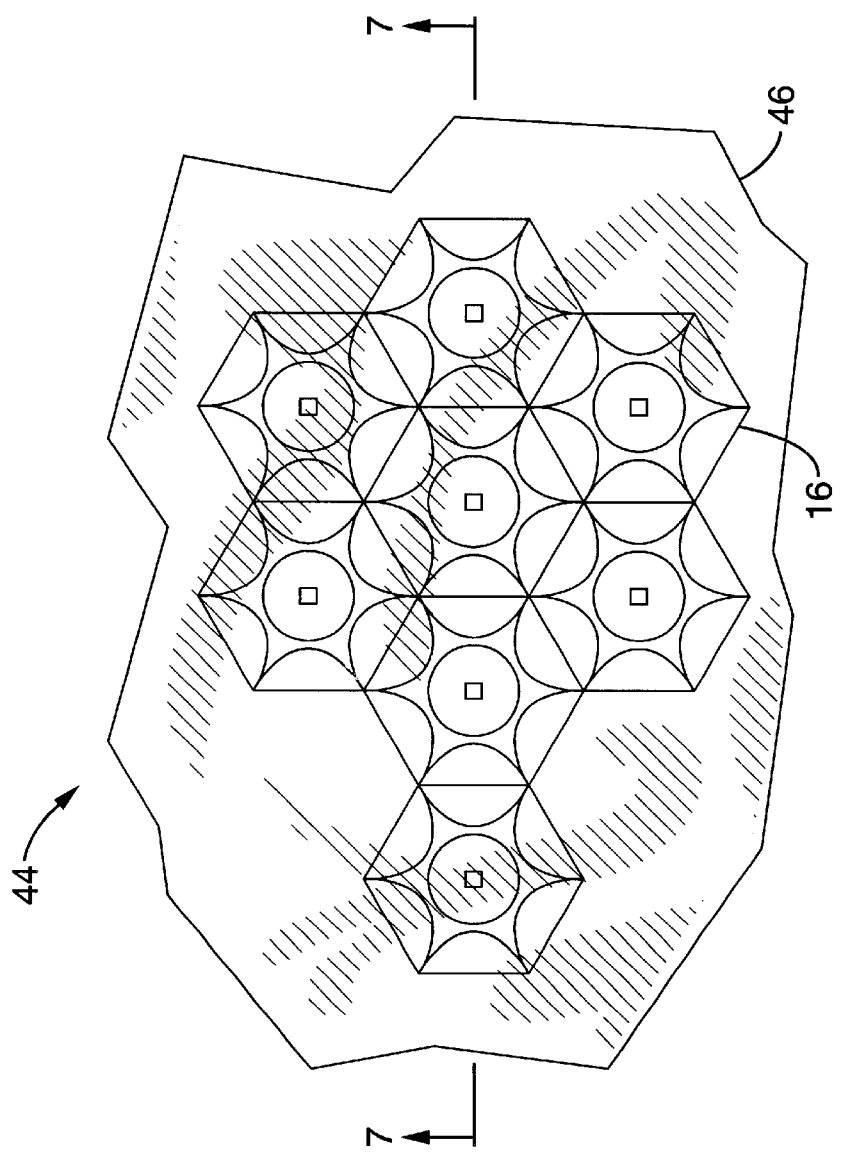
FIG. 6 is a top partial schematic view of an array of photosensors of FIG. 1 with hexagonal-shaped entrance windows and honeycomb-like packing.
Figure 5:
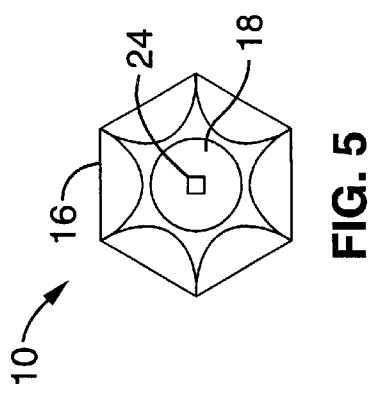
FIG. 5 is a top schematic view of the photosensor of FIG. 1 showing a hexagonal-shaped entrance window.
Figure 7:
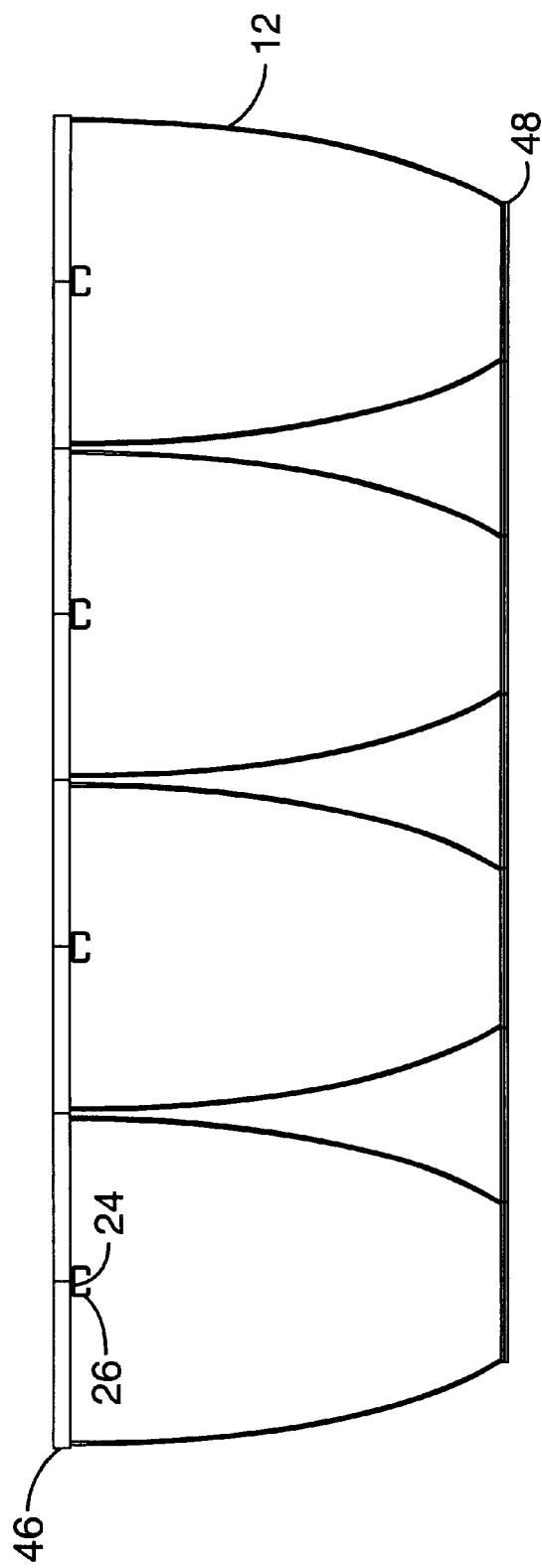
FIG. 7 is a cross-section view of the array shown in FIG. 6 taken through line 7—7.

Referring now to FIG. 5 through FIG. 7, by making entrance window 16 hexagonal in shape, a hexagonally packed honeycomb multi-pixel camera structure 44 may be constructed using a plurality of photosensors 10 serving as individual pixel elements. The hexagonal shape allows for an array to be constructed with little or no dead space between photosensor entrance windows, thereby increasing resolution and efficiency. Two basically different approaches are possible: (a) a structure constructed from a plurality of separate vacuum-sealed photosensors, or (b) a structure formed from unit contained in a common vacuum container with a common entrance window 46 and possibly a common photocathode 48. The second approach, which is shown in FIG. 6 and FIG. 7 offers a smaller dead area. The photocathode can be CsI, type III–V material, a multi-bialkalai sheet on a glass plate, or other materials.

Thus far the invention has been described generally without regard for color detection. However, color detection is also possible by employing the same or similar techniques shown in FIG. 8 through FIG. 10. Single-photon color sensitivity without destructive filtering or spectral analysis would be of great benefit in all high-energy physics applications, but in particular in a large water Cherenkov experiment where, without color sensitivity, the spectral dependence of the speed of light leads to a significant smearing in the Cherenkov photon time of flight resolution.

Figure 8:
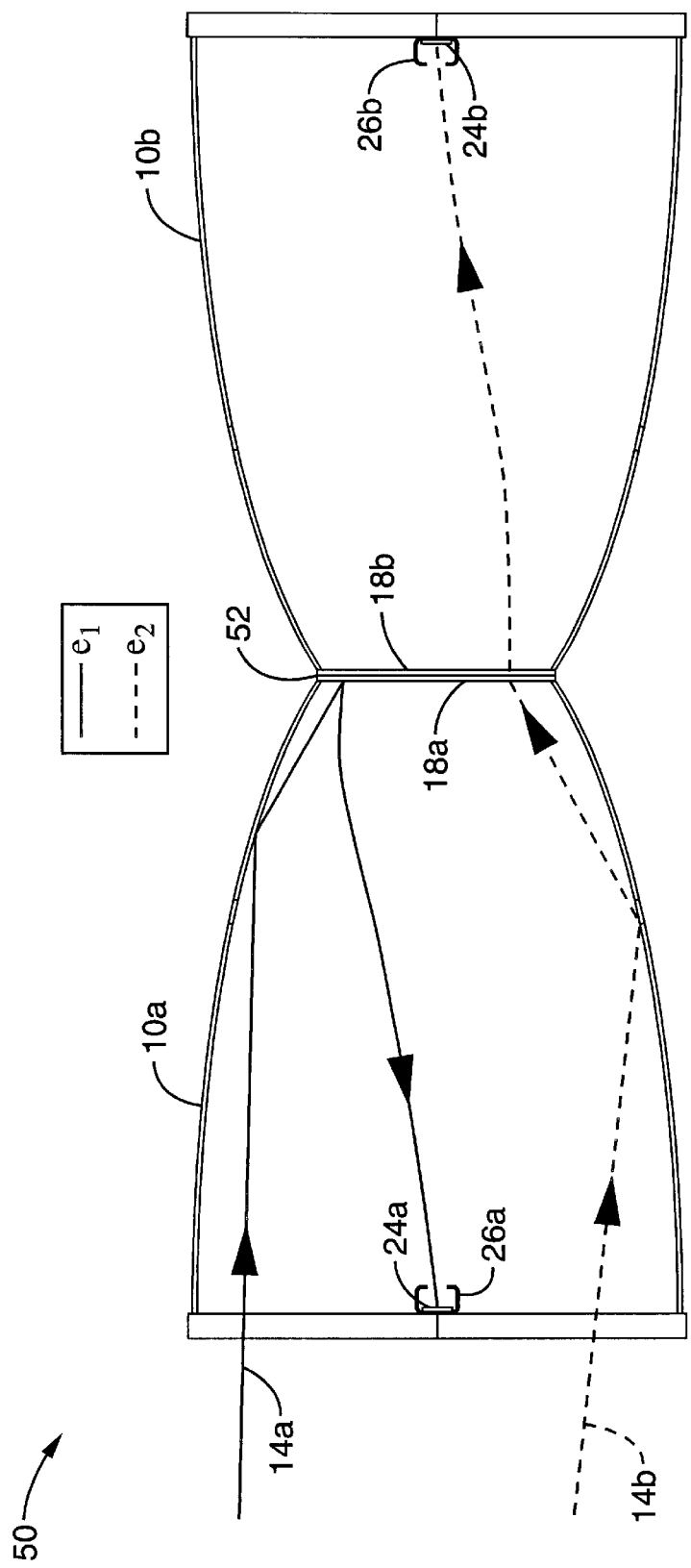
FIG. 8 is a side schematic view of a two-color photosensor according to the present invention.

Referring first to FIG. 8, a two-color photosensor 50 is shown comprising a pair of photosensors 10a, 10b in a back-to-back configuration. Photosensors 10a, 10b are the same as previously described except for the back-to-back photocathodes 18a, 18b which are made from different materials having different wavelength sensitivities. The photocathode materials are selected such that photons of shorter wavelengths (e.g., blue) are mostly absorbed in photocathode 18a while longer wavelength photons (e.g. red) will pass through photocathode 18a and strike photocathode 18b.

For example, photons 14a, 14b having different colors enter the entrance window 16 from the left side of the photosensor. Photons 14a, having a shorter wavelength than photons 14b, are absorbed in photocathode 18a and the corresponding emitted photoelectrons e1 are focused onto the electron sensor 24a on the left side. Photons 14b of longer wavelength pass through photocathode 18a and through a thin, glass plate 52 between the photocathodes (not shown) and into photocathode 18b on the other side. Photoelectrons e2 released from photocathode 18b are focused onto electron sensor 24b on the right side. Additionally, even longer wavelength photons (e.g., green) that passed through photocathode 18b will be mostly reflected back to the same photocathode since photosensor 10b acts as a light trap for those wavelengths. Therefore, this configuration allows photons of different colors to be detected.

Figure 9:
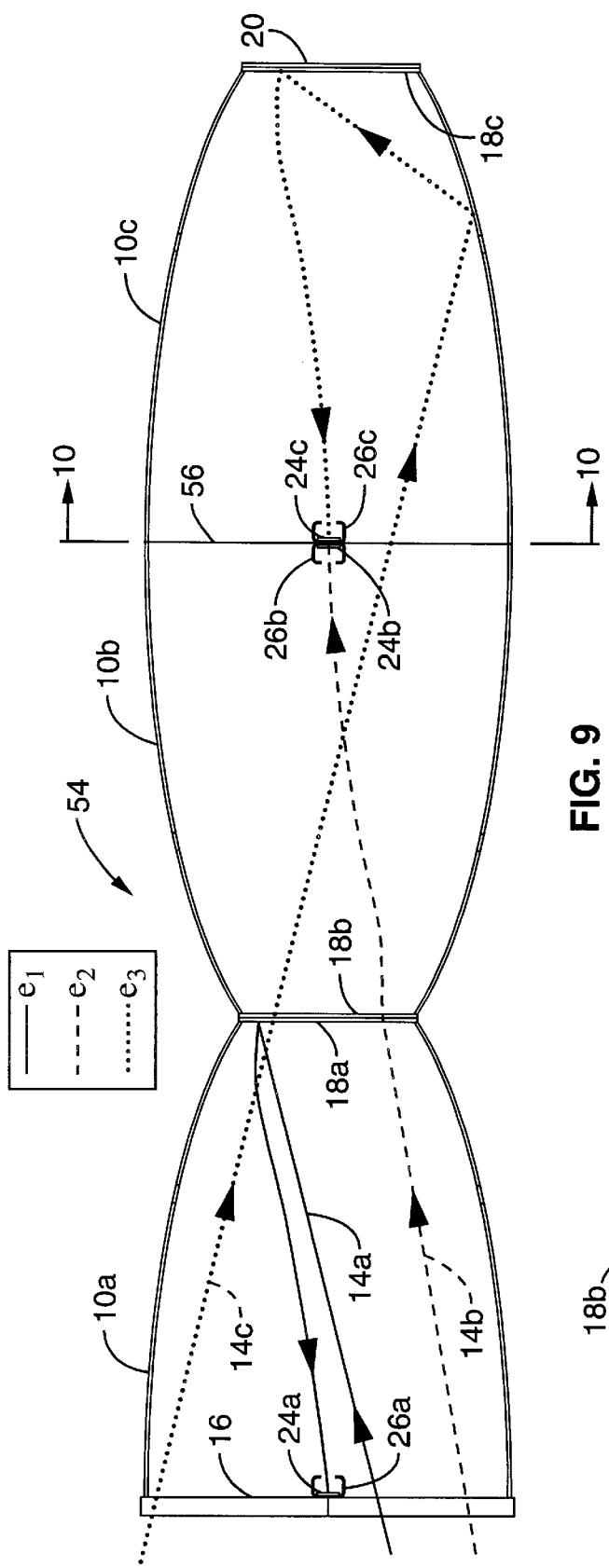
FIG. 9 is a side schematic view of a three-color photosensor according to the present invention.
Figure 10:
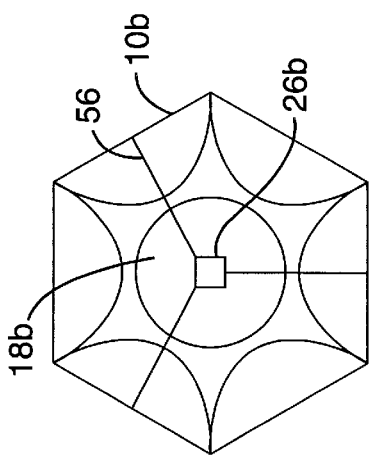
FIG. 10 is a cross-section view of the photosensor shown in FIG. 9 taken through line 10—10.

FIG. 9 and FIG. 10 show an embodiment of a three-color photosensor 54 having a third photosensor 10c with a sensitivity that is shifted more toward longer wavelengths (e.g., green) as compared to photosensors 10a, 10b. This embodiment includes a third photocathode 18c whose sensitivity is shifted more towards long wavelengths as compared to photocathode 18b, and an associated electron sensor 24c. Longer wavelength photons 14c will pass through photocathodes 18a, 18b and into photocathode 18c on the far right. Photoelectrons e3 released from photocathode 18c are focused onto electron sensor 24c for detection. Note that electron sensors 24b, 24c and feedback protection electrodes 26b, 26c are suspended by wires 56 in a tri-support configuration or the like. Alternatively, glass plates or other forms of support could be used. Note also from FIG. 10 that the photosensors have a hexagonal cross-section for array packing purposes, but could have a circular cross-section as well.

As can be seen, therefore, the invention can be configured for detection of one, two, three, or more colors by using complementary photocathode materials that are reflective for certain wavelengths but transmissive for others. Also, not only can the present invention provide color sensitivity without destructive filtering, but also provides for significant extension of the spectral sensitivity of a photosensor because two three or more photocathode materials may be used simultaneously. Furthermore, if a sharp color sensitivity boundary is needed, interference filters that reflect (rather than absorb) light beyond a precisely defined limit can be used to strictly separate different color detection sections.

Accordingly, the present invention provides a high sensitivity photosensor with a photocathode operating in reflective mode that can be used in a wide variety of applications, including, but not limited to, replacing PMTs and HPDs in applications that use such devices, Cherenkov cameras, color photosensors, and even solar energy concentrators with multi-junction photovoltaic cells. The invention manifests conceptual and constructional simplicity, high quantum efficiency at low manufacturing cost, optimal usage of the photocathode surface, fast and position-independent time response, a flat photocathode surface that allows for epitaxially grown photocathodes, single photon resolution, negligible dead area, flat angular acceptance and sharp angular cutoff for incoming light, the ability to use circular or hexagonal shaped entrance windows, no need for additional light concentrators, efficient magnetic field screening without acceptance shadowing, and efficient photocathode cooling.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A photosensor, comprising:
   a compound parabolic light concentrator having first and second ends;
   an electron sensor positioned at said first end of said light concentrator;
   a reflective mode photocathode positioned at said second end of said light concentrator; and
   an entrance window at said first end of said light concentrator;
   wherein said electron sensor is attached to and positioned central to said entrance window.

2. A photosensor as recited in claim 1, wherein said entrance window is hexagonal-shaped.

3. A photosensor, comprising:
   a compound parabolic light concentrator having first and second ends;
   an electron sensor positioned at said first end of said light concentrator; and
   a reflective mode photocathode positioned at said second end of said light concentrator;
   wherein said light concentrator comprises an evacuated chamber enclosing said electron sensor and said photocathode.

4. A photosensor, comprising:
   a compound parabolic light concentrator having first and second ends;
   an electron sensor positioned at said first end of said light concentrator; and
   a reflective mode photocathode positioned at said second end of said light concentrator;
   wherein said light concentrator comprises a Winston cone.

5. A photosensor as recited in claim 1, 3 or 4, wherein said photocathode comprises a type III–V material.

6. A photosensor as recited in claims 5, wherein said type III–V material comprises GaAsP.

7. A photosensor as recited in claim 1, 3 or 4, further comprising a positive-ion feedback protection electrode adjacent said electron sensor.

8. A photosensor as recited in claim 1, 3 or 4 wherein said light concentrator includes an interior reflective coating.

9. A photosensor as recited in claim 1, 3 or 4, further comprising means for focusing electrons emitted by said photocathode onto said electron sensor.

10. A photosensor as recited in claim 9, wherein said means comprises first and second annular electrodes interior to said light concentrator and separated by a gap.

11. A photosensor as recited in claim 1, 3 or 4, wherein said electron sensor is selected from the group consisting essentially of a P-I-N diode, an avalanche photo diode, and a scintillator.

12. A photosensor as recited in claim 3 or 4, further comprising an entrance window at said first end of said light concentrator.

13. A photosensor as recited in claim 12, wherein said entrance window is hexagonal-shaped.

14. A photosensor as recited in claim 12, if wherein said electron sensor is attached to and positioned central to said entrance window.

15. A photosensor, comprising:
    a compound parabolic light concentrator having first and second ends;
    an electron sensor positioned at said first end of said light concentrator;
    a positive-ion feedback protection electrode adjacent said electron sensor;
    a reflective mode photocathode positioned at said second end of said light concentrator; and
    means for focusing electrons emitted by said photocathode onto said electron sensor.

16. A photosensor, comprising:
a compound parabolic light concentrator having first and second ends;
an electron sensor positioned at said first end of said light concentrator
a reflective mode photocathode positioned at said second end of said light concentrator; and
means for focusing electrons emitted by said photocathode onto said electron sensor;
wherein said means comprises first and second annular electrodes interior to said light concentrator and separated by a gap.

17. A photosensor, comprising:
a compound parabolic light concentrator having first and second ends;
an electron sensor positioned at said first end of said light concentrator;
a reflective mode photocathode positioned at said second end of said light concentrator; and
means for focusing electrons emitted by said photocathode onto said electron sensor;
wherein said light concentrator comprises an evacuated chamber enclosing said electron sensor and said photocathode.

18. A photosensor, comprising:
a compound parabolic light concentrator having first and second ends;
an electron sensor positioned at said first end of said light concentrator;
a reflective mode photocathode positioned at said second end of said light concentrator; and
means for focusing electrons emitted by said photocathode onto said electron sensor;
wherein said light concentrator comprises a Winston cone.

19. A photosensor as recited in claims 15, 16, 17, 18, further comprising an entrance window at said first end of said light concentrator.

20. A photosensor as recited in claim 19, wherein said entrance window is hexagonal-shaped.

21. A photosensor as recited in claim 19, wherein said electron sensor is attached to and positioned central to said entrance window.

22. A photosensor, comprising:
a compound parabolic light concentrator having first and second ends;
an electron sensor positioned at said first end of said light concentrator;
an entrance window at said first end of said light concentrator;
wherein said electron sensor is attached to and positioned central to said entrance window;
a reflective mode photocathode positioned at said second end of said light concentrator; and
means for focusing electrons emitted by said photocathode onto said electron sensor.

23. A photosensor as recited in claim 15, 16, 17, 18 or 22, wherein said photocathode comprises a type III–V material.

24. A photosensor as recited in claim 23, if wherein said type III–V material comprises GaAsP.

25. A photosensor as recited in claims 16, 17, 18, 22, further comprising a positive-ion feedback protection electrode adjacent said electron sensor.

26. A photosensor as recited in claims 15, 16, 17, 18, 22, wherein said light concentrator includes an interior reflective coating.

27. A photosensor as recited in claims 15, 16, 17, 18, 22, wherein said electron sensor is selected from the group consisting essentially of a P-I-N diode, an avalanche photo diode, and a scintillator.

28. A photosensor as recited in claim 22, wherein said entrance window is hexagonal-shaped.

29. A photosensor, comprising:
a compound parabolic light concentrator having first and second ends;
an electron sensor positioned at said first end of said light concentrator;
a reflective mode photocathode positioned at said second end of said light concentrator; and
first and second annular electrodes interior to said light concentrator and separated by a gap, said electrodes configured for focusing photoelectrons emitted by said photocathode onto said electron sensor.

30. A photosensor as recited in claim 29, wherein said light concentrator comprises an evacuated chamber enclosing said electron sensor and said photocathode.

31. A photosensor as recited in claim 29, wherein said light concentrator comprises a Winston cone.

32. A photosensor as recited in claim 29, wherein said photocathode comprises a type III–V material.

33. A photosensor as recited in claim 32, wherein said type III–V material comprises GaAsP.

34. A photosensor as recited in claim 29, further comprising a positive-ion feedback protection electrode adjacent said electron sensor.

35. A photosensor as recited in claim 29, wherein said light concentrator includes an interior reflective coating.

36. A photosensor as recited in claim 29, wherein said electron sensor is selected from the group consisting essentially of a P-I-N diode, an avalanche photo diode, and a scintillator.

37. A photosensor as recited in claim 29, further comprising an entrance window at said first end of said light concentrator.

38. A photosensor as recited in claim 37, wherein said entrance window is hexagonal-shaped.

39. A photosensor as recited in claim 37, wherein said electron sensor is attached to and positioned central to said entrance window.

40. A photosensor, comprising:
a compound parabolic light concentrator having first and second ends;
an electron sensor positioned at said first end of said light concentrator;
a positive-ion feedback protection electrode adjacent said electron sensor;
a reflective mode photocathode positioned at said second end of said light concentrator; and
first and second annular electrodes interior to said light concentrator and separated by a gap, said electrodes configured for focusing photoelectrons emitted by said photocathode onto said electron sensor.

41. A photosensor as recited in claim 40, wherein said light concentrator comprises an evacuated chamber enclosing said electron sensor and said photocathode.

42. A photosensor as recited in claims 40, wherein said light concentrator comprises a Winston cone.

43. A photosensor as recited in claim 40, wherein said photocathode comprises a type III–V material.

44. A photosensor as recited in claim 43, wherein said type III–V material comprises GaAsP.

45. A photosensor as recited in claim 40, wherein said light concentrator includes an interior reflective coating.

46. A photosensor as recited in claim 40, wherein said electron sensor is selected from the group consisting essentially of a P-I-N diode, an avalanche photo diode, and a scintillator.

47. A photosensor as recited in claim 40, further comprising an entrance window at said first end of said light concentrator.

48. A photosensor as recited in claim 47, wherein said entrance window is hexagonal-shaped.

49. A photosensor as recited in claim 47, wherein said electron sensor is attached to and positioned central to said entrance window.

50. A photosensor, comprising:
    a compound parabolic light concentrator having first and second ends;
    an entrance window positioned at said first end of said light concentrator;
    an electron sensor positioned at said first end of said light concentrator central to said entrance window;
    a positive-ion feedback protection electrode adjacent said electron sensor;
    a reflective mode photocathode positioned at said second end of said light concentrator; and
    first and second annular electrodes interior to said light concentrator and separated by a gap, said electrodes configured for focusing photoelectrons emitted by said photocathode onto said electron sensor.

51. A photosensor as recited in claim 50, wherein said light concentrator comprises an evacuated chamber enclosing said electron sensor and said photocathode.

52. A photosensor as recited in claim 50, wherein said light concentrator comprises a Winston cone.

53. A photosensor as recited in claim 50, wherein said photocathode comprises a type III–V material.

54. A photosensor as recited in claim 53, wherein said type III–V material comprises GaAsP.

55. A photosensor as recited in claim 50, wherein said light concentrator includes an interior reflective coating.

56. A photosensor as recited in claim 50, wherein said electron sensor is selected from the group consisting essentially of a P-I-N diode, an avalanche photo diode, and a scintillator.

57. A photosensor as recited in claim 50, wherein said entrance window is hexagonal-shaped.

58. A photosensor, comprising:
    a compound parabolic light concentrator having first and second ends;
    an entrance window positioned at said first end of said light concentrator;
    an electron sensor positioned at said first end of said light concentrator central to said entrance window;
    a positive-ion feedback protection electrode adjacent said electron sensor;
    a reflective mode photocathode positioned at said second end of said light concentrator; and
    first and second annular electrodes interior to said light concentrator and separated by a gap, said electrodes configured for focusing photoelectrons emitted by said photocathode onto said electron sensor;
    wherein said light concentrator is configured as an evacuated chamber enclosing said electron sensor, said electrodes, and said photocathode.

59. A photosensor as recited in claim 58, wherein said light concentrator comprises a Winston cone.

60. A photosensor as recited in claim 58, wherein said photocathode comprises a type III–V material.

61. A photosensor as recited in claim 60, wherein said type in-v material comprises GaAsP.

62. A photosensor as recited in claim 60, wherein said light concentrator includes an interior reflective coating.

63. A photosensor as recited in claim 60, wherein said electron sensor is selected from the group consisting essentially of a P-I-N diode, an avalanche photo diode, and a scintillator.

64. A photosensor as recited in claim 60, wherein said entrance window is hexagonal-shaped.

65. A photosensor, comprising:
    a compound parabolic light concentrator having first and second ends and an interior reflective coating between said first and second ends;
    an entrance window positioned at said first end of said light concentrator;
    an electron sensor positioned at said first end of said light concentrator central to said entrance window;
    a positive-ion feedback protection electrode adjacent said electron sensor;
    a reflective mode photocathode positioned at said second end of said light concentrator; and
    first and second annular electrodes interior to said light concentrator and separated by a gap, said electrodes configured for focusing photoelectrons emitted by said photocathode onto said electron sensor;
    wherein said light concentrator is configured as an evacuated chamber enclosing said electron sensor, said electrodes, and said photocathode.

66. A photosensor as recited in claim 65, wherein said light concentrator comprises a Winston cone.

67. A photosensor as recited in claim 65, wherein said photocathode comprises a type III–V material.

68. A photosensor as recited in claim 67, wherein said type III–V material comprises GaAsP.

69. A photosensor as recited in claim 65, wherein said electron sensor is selected from the group consisting essentially of a P-I-N diode, an avalanche photo diode, and a scintillator.

70. A photosensor as recited in claim 65, wherein said entrance window is hexagonal-shaped.

71. A photosensor, comprising:
    a compound parabolic light concentrator having first and second ends;
    an electron sensor positioned at said first end of said light concentrator;
    a reflective mode photocathode positioned at said second end of said light concentrator; and
    a positive-ion feedback protection electrode adjacent said electron sensor.

72. A photosensor, comprising:
    a compound parabolic light concentrator having first and second ends;
    an electron sensor positioned at said first end of said light concentrator;
    a reflective mode photocathode positioned at said second end of said light concentrator; and
    means for focusing electrons emitted by said photocathode onto said electron sensor;
    said means comprising first and second annular electrodes interior to said light concentrator and separated by a gap.

* * * * *